(12) United States Patent
Guillorn et al.

(10) Patent No.: US 10,026,810 B2
(45) Date of Patent: *Jul. 17, 2018

(54) CO-INTEGRATION OF SILICON AND SILICON-GERMANIUM CHANNELS FOR NANOSHEET DEVICES

(71) Applicant: INTERNATIONAL BUSINESS MACHINES CORPORATION, Armonk, NY (US)

(72) Inventors: Michael A. Guillorn, Cold Springs, NY (US); Isaac Lauer, Yorktown Heights, NY (US); Nicolas J. Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/475,917

(22) Filed: Mar. 31, 2017

(65) Prior Publication Data
US 2017/0256612 A1  Sep. 7, 2017

Related U.S. Application Data

(63) Continuation of application No. 15/057,439, filed on Mar. 1, 2016, now Pat. No. 9,755,017.

(51) Int. Cl.
*H01L 27/12* (2006.01)
*H01L 29/06* (2006.01)
(Continued)

(52) U.S. Cl.
CPC .... *H01L 29/0673* (2013.01); *H01L 21/02532* (2013.01); *H01L 21/30604* (2013.01);
(Continued)

(58) Field of Classification Search
USPC ................ 257/190, 351, E21.409; 438/270; 977/755, 924, 953
See application file for complete search history.

(56) References Cited

U.S. PATENT DOCUMENTS

| | | | |
|---|---|---|---|
| 6,600,170 B1 | 7/2003 | Xiang | |
| 6,607,948 B1 * | 8/2003 | Sugiyama | ......... H01L 21/02381 257/E29.056 |

(Continued)

OTHER PUBLICATIONS

List of IBM Patents or Patent Applications Treated as Related dated Mar. 31, 2017, 2 pages.

(Continued)

*Primary Examiner* — Tram H Nguyen
(74) *Attorney, Agent, or Firm* — Tuntunjian & Bitetto, P.C.; Vazken Alexanian

(57) ABSTRACT

Nanosheet semiconductor devices and methods of forming the same include forming a first nanosheet stack in a first device region with layers of a first channel material and layers of a sacrificial material. A second nanosheet stack is formed in a second device region with layers of a second channel material, layers of the sacrificial material, and a liner formed around the layers of the second channel material. The sacrificial material is etched away, but the liner protects the second channel material from the etch. Gate stacks are formed over and around the layers of first and second channel material to form respective first and second semiconductor devices in the first and second device regions.

15 Claims, 9 Drawing Sheets

(51) Int. Cl.
*H01L 21/02* (2006.01)
*H01L 21/306* (2006.01)
*H01L 29/423* (2006.01)
*H01L 29/66* (2006.01)
*H01L 27/092* (2006.01)
*H01L 21/84* (2006.01)
*H01L 21/8238* (2006.01)
*H01L 21/3213* (2006.01)

(52) U.S. Cl.
CPC ........... *H01L 21/32133* (2013.01); *H01L 21/823807* (2013.01); *H01L 21/823821* (2013.01); *H01L 21/823828* (2013.01); *H01L 21/845* (2013.01); *H01L 27/0924* (2013.01); *H01L 27/1211* (2013.01); *H01L 29/42392* (2013.01); *H01L 29/66545* (2013.01)

(56) References Cited

U.S. PATENT DOCUMENTS

| | | | |
|---|---|---|---|
| 6,955,952 B2 | 10/2005 | Yeo et al. | |
| 7,217,608 B1 | 5/2007 | Xiang | |
| 7,741,169 B2 | 6/2010 | Lu et al. | |
| 8,053,301 B2 | 11/2011 | Jaeger et al. | |
| 8,623,729 B2 | 1/2014 | Jeong et al. | |
| 8,828,851 B2 | 9/2014 | Loubet et al. | |
| 9,735,234 B1* | 8/2017 | Cheng | H01L 29/0673 |
| 9,755,017 B1* | 9/2017 | Guillorn | H01L 29/0673 |
| 2003/0077867 A1* | 4/2003 | Fitzergald | H01L 21/02381 438/285 |
| 2006/0216897 A1* | 9/2006 | Lee | B82Y 10/00 438/282 |
| 2008/0135949 A1* | 6/2008 | Lo | B82Y 10/00 257/401 |
| 2014/0084379 A1 | 3/2014 | Jeong et al. | |
| 2014/0091360 A1* | 4/2014 | Pillarisetty | H01L 21/8258 257/190 |
| 2014/0252483 A1 | 9/2014 | Nagumo | |
| 2014/0264280 A1 | 9/2014 | Kim et al. | |
| 2015/0295084 A1 | 10/2015 | Obradovic et al. | |

OTHER PUBLICATIONS

Office Action for U.S. Appl. No. 15/626,734 dated Apr. 16, 2018 (8 pages).

* cited by examiner

US 10,026,810 B2

CO-INTEGRATION OF SILICON AND SILICON-GERMANIUM CHANNELS FOR NANOSHEET DEVICES

BACKGROUND

Technical Field

The present invention relates to semiconductor devices and, more particularly, to the integration of silicon and silicon-germanium nanosheet devices on a single chip.

Description of the Related Art

Semiconductor devices may be formed with "nanosheets," where a thin sheet of semiconductor material is used, for example, as the channel of a field effect transistor (FET). While nanosheets may be formed from a variety of semiconductor materials, forming multiple such devices using different respective channel materials can be challenging and may necessitate the use of exotic processes to selectively etch only one type of channel material. These exotic chemistries may be damaging to other device components, for example making it difficult to form good source/drain isolation

SUMMARY

A method for forming nanosheet semiconductor devices includes forming a first nanosheet stack in a first device region comprising layers of a first channel material and layers of a sacrificial material. A second nanosheet stack is formed in a second device region comprising layers of a second channel material, layers of the sacrificial material, and a liner formed around the layers of the second channel material. The sacrificial material is etched away. The liner protects the second channel material from the etch. Gate stacks are formed over and around the layers of first and second channel material to form respective first and second semiconductor devices in the first and second device regions.

An integrated chip includes a first semiconductor device comprising a plurality of first nanosheet channel layers of a first semiconductor material. A second semiconductor device comprises a plurality of second nanosheet channel layers of a second semiconductor material and a liner formed around the second nanosheet channel layers. Gate stacks are formed over and around the first and second nanosheet channel layers respectively.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention form multiple nanosheet devices on a same chip from multiple different materials. To prevent etching processes for a first nanosheet material from interfering with a second nanosheet material, a protective cladding layer is used. This makes it possible to selectively etch features of the respective devices without resorting to exotic chemistries.

Figure 1:
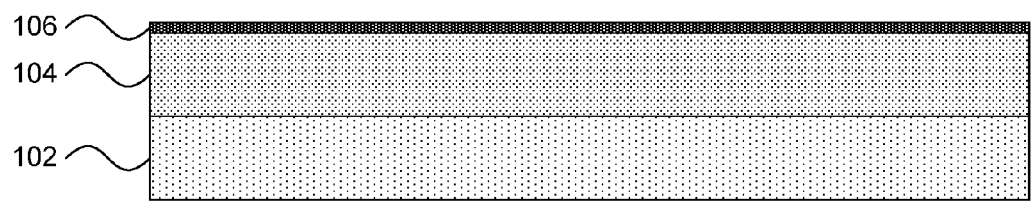
FIG. 1 is a cross-sectional diagram of a step in the formation of multiple nanosheet semiconductor devices on a single chip in accordance with the present principles.

Referring now to the drawings in which like numerals represent the same or similar elements and initially to FIG. 1, a step in forming multiple nanosheet devices having different channel materials is shown. A substrate is formed from a semiconductor layer 104 on an insulator layer 102. It should be recognized that the substrate layer 104 may alternatively be formed from a bulk semiconductor material without the underlying insulator layer 102. It is specifically contemplated that the insulator layer 102 may be silicon dioxide, but it should be understood that any appropriate material may be used including, e.g., any buried oxide or a glass layer. A hardmask layer 106 is deposited over the substrate layer 104.

In one example, the semiconductor layer 104 may be formed from a silicon-containing material. Illustrative examples of silicon-containing materials suitable for the bulk-semiconductor substrate include, but are not limited to, silicon, silicon germanium, silicon germanium carbide, silicon carbide, polysilicon, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc sellenide.

Alternatively, the semiconductor layer 104 may be formed from a type III-V semiconductor material. This denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of aluminum antimonide, aluminum arsenide, aluminum nitride, aluminum phosphide, gallium arsenide, gallium phosphide, indium antimonide, indium arsenic, indium nitride, indium phosphide, aluminum gallium arsenide, indium gallium phosphide, aluminum indium arsenic, aluminum indium antimonide, gallium arsenide nitride, gallium arsenide antimonide, aluminum gallium nitride, aluminum gallium phosphide, indium gallium nitride, indium arsenide antimonide, indium gallium antimonide, aluminum gallium indium phosphide, aluminum gallium arsenide phosphide, indium gallium arsenide phosphide, indium arsenide antimonide phosphide, aluminum indium arsenide phosphide, aluminum gallium arsenide nitride, indium gallium arsenide nitride, indium aluminum arsenide nitride, gallium arsenide antimonide nitride, gallium indium nitride arsenide aluminum antimonide, gallium indium arsenide antimonide phosphide, and combinations thereof.

It is specifically contemplated that the hardmask layer 106 may be formed from silicon nitride, but any appropriate dielectric material may be used in its place. Other materials for the hardmask layer 106 may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

In one embodiment, the hardmask layer 106 is deposited by chemical vapor deposition (CVD), but it should be understood that atomic layer deposition (ALD), physical vapor deposition (PVD), or gas cluster ion beam (GCIB) deposition may be used instead.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (EPCVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
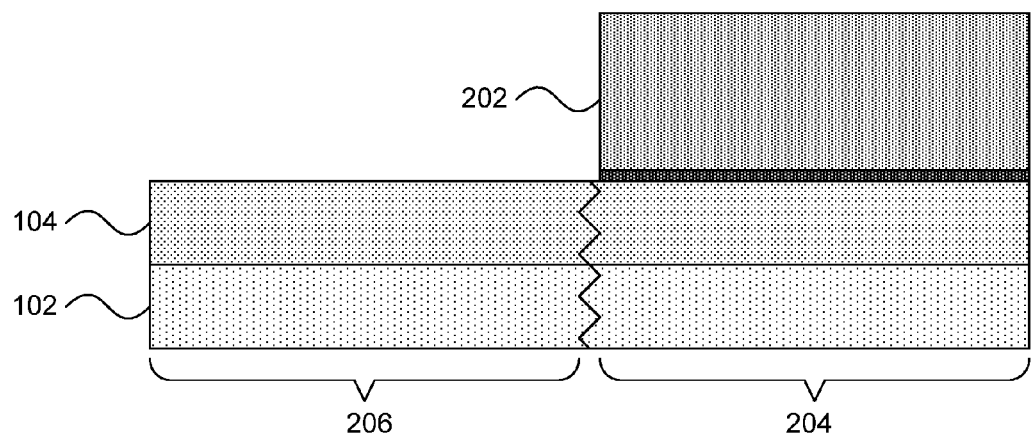
FIG. 2 is a cross-sectional diagram of a step in the formation of multiple nanosheet semiconductor devices on a single chip in accordance with the present principles.

Referring now to FIG. 2, a step in forming multiple nanosheet devices having different channel materials is shown. A mask 202 is deposited over a first region 204 of the substrate 104. The material of the hardmask layer 106 is stripped away from the unmasked region 206. The two regions 204/206 define respective p-type and n-type device regions, for example pFETs and nFETs. It should be understood that the two regions 204 and 206 are shown as being adjacent for the sake of compactness and ease of description—in actual embodiments the two regions may be located anywhere on a chip.

Figure 3:
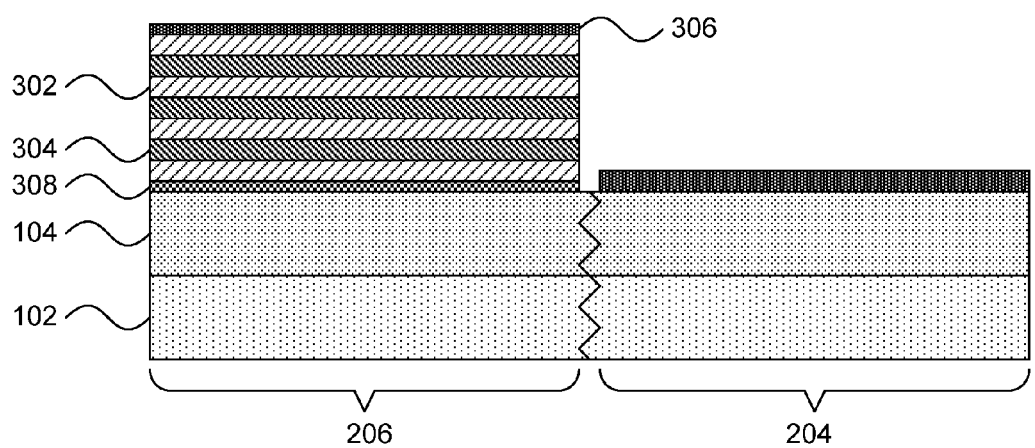
FIG. 3 is a cross-sectional diagram of a step in the formation of multiple nanosheet semiconductor devices on a single chip in accordance with the present principles.

Referring now to FIG. 3, a step in forming multiple nanosheet devices having different channel materials is shown. A source/drain isolation layer 308 is formed on the second region 206. It is specifically contemplated that the channel region may be a doped semiconductor material. In one embodiment, the source/drain isolation layer 308 may be a p-type doped silicon or silicon germanium layer that is in situ doped during formation or is formed by ion implantation. The source/drain isolation layer 308 has a dopant type opposite to that of the eventual source and drain structures to provide junction isolation and reduce source-to-drain leakage.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor In a silicon containing substrate examples of n-type dopants, i.e., impurities, include but are not limited to antimony, arsenic and phosphorous. In this case, a p-type dopant is used for the layer 308 of, e.g., an nFET second region 206.

A stack of alternating semiconductor layers 302/304 is deposited in the second region 206. It is specifically contemplated that the stack may be formed from alternating silicon and silicon germanium nanosheets, but it is should be understood that alternative semiconductor materials may be used instead. In one embodiment, there are seven layers, with silicon germanium layers having a germanium concentration of about 50% being the first set of layers 302, including a top layer, and with pure silicon layers being the second set of layers 304. After formation of the stack in the second region 206, the mask 202 is removed and an additional layer of hardmask material 306 is deposited over all horizontal surfaces.

Figure 4:
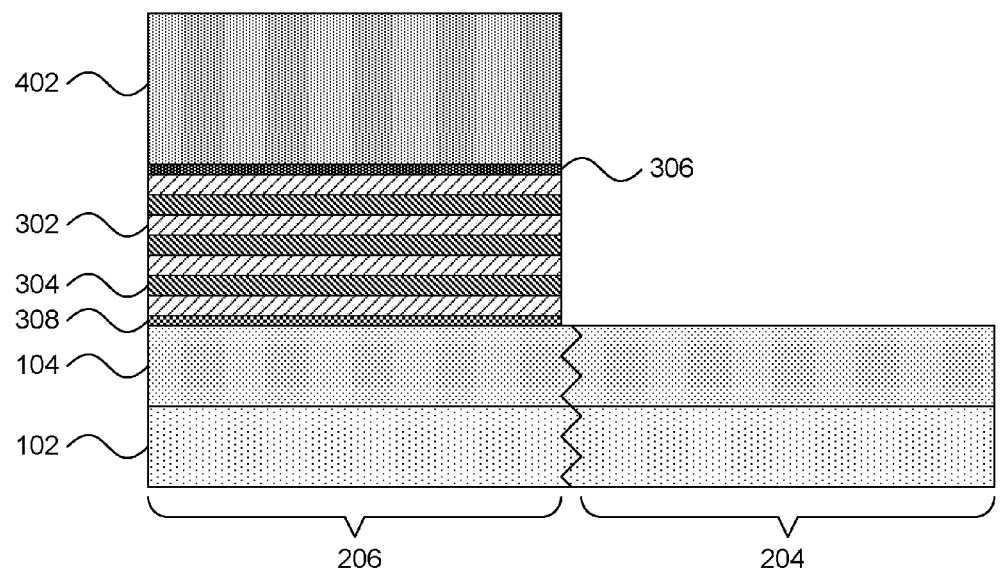
FIG. 4 is a cross-sectional diagram of a step in the formation of multiple nanosheet semiconductor devices on a single chip in accordance with the present principles.

Referring now to FIG. 4, a step in forming multiple nanosheet devices having different channel materials is shown. A mask 402 is deposited over the second device region 206. The hardmask material over the first device region 204 is stripped away to leave the first device region 204 exposed.

Figure 5:
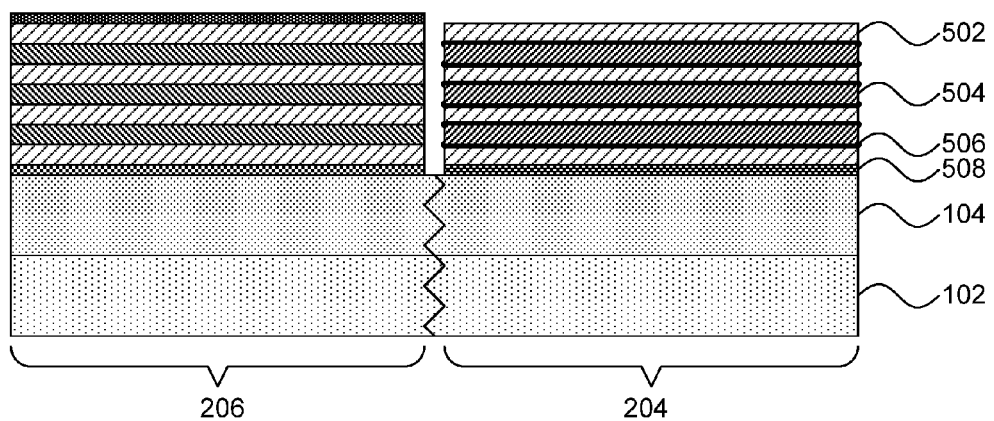
FIG. 5 is a cross-sectional diagram of a step in the formation of multiple nanosheet semiconductor devices on a single chip in accordance with the present principles.

Referring now to FIG. 5, a step in forming multiple nanosheet devices having different channel materials is shown. A layer 508 is formed on the second region 206. It is specifically contemplated that the channel region may be a doped semiconductor material. In one embodiment, the layer 508 may be an n-type doped silicon or silicon germanium layer that is in situ doped during formation or is formed by ion implantation. In this case, an n-type dopant is used for the layer 508 of, e.g., a pFET second region 204.

A stack of alternating semiconductor layers is 502/504 is deposited in the first region 204 with a thin layer 506 of a third semiconductor material in between each alternating layer 502/504. It is specifically contemplated that the alternating layers 502/504 may be formed from alternating nanosheets of silicon germanium, with a 50% concentration of germanium and with a 30% concentration of germanium respectively. In one embodiment there are seven layers, with the 50% layers being the first set of layers 502, including a top layer, and with the 30% layers being the second set of layers 504. It is specifically contemplated that the layers 506 of the third semiconductor material may be formed from pure silicon and may have an exemplary thickness of about 2 nm. The layers 506 of the third semiconductor material are used to provide superior mechanical stability for the stack and as an etch stop layer for subsequent fabrication processes.

At this point, the sheets of alternating semiconductor material may be etched and isolated to form multiple parallel fins. The details of fin formation will be discussed below. It should be understood that the following set of figures illustrate a single fin, cut along its length.

Figure 6:
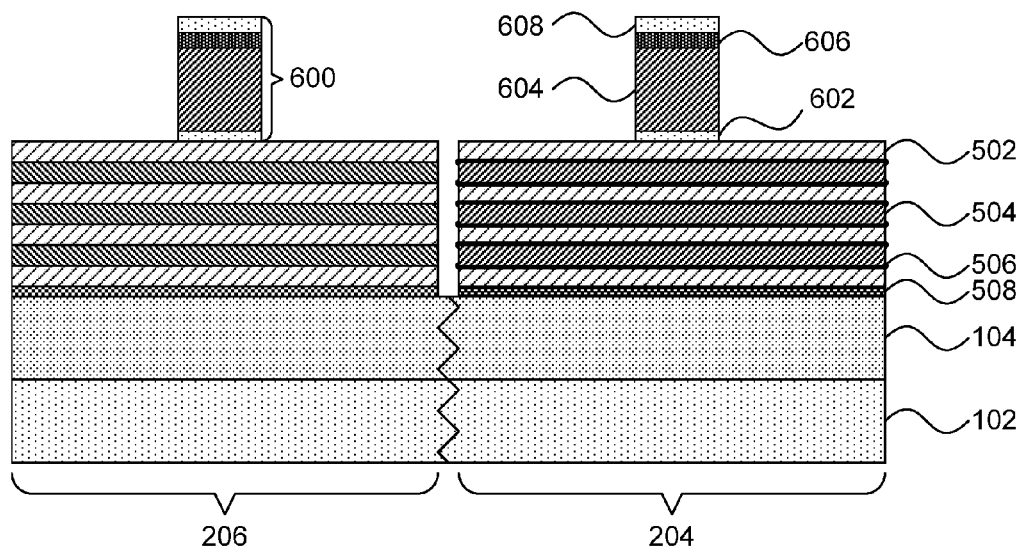
FIG. 6 is a cross-sectional diagram of a step in the formation of multiple nanosheet semiconductor devices on a single chip in accordance with the present principles.

Referring now to FIG. 6, a step in forming multiple nanosheet devices having different channel materials is shown. Any remaining hardmask material 306 is removed. Dummy gate stacks 600 are formed over the respective fins in device regions 204 and 206. The dummy gate stacks 600 may include a dummy gate dielectric 602, a dummy gate 604, a hardmask cap 606, and a mask 608. The dummy gate 604 may be formed from semiconductor material, such as polysilicon or amorphous silicon, or a dielectric material such as an oxide, nitride, or oxynitride material. The dummy gate stack 600 may be formed by depositing the various layers and subsequently removing any material not covered by, e.g., masks 606, using an anisotropic etch such as a reactive ion etch (RIE).

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 7:
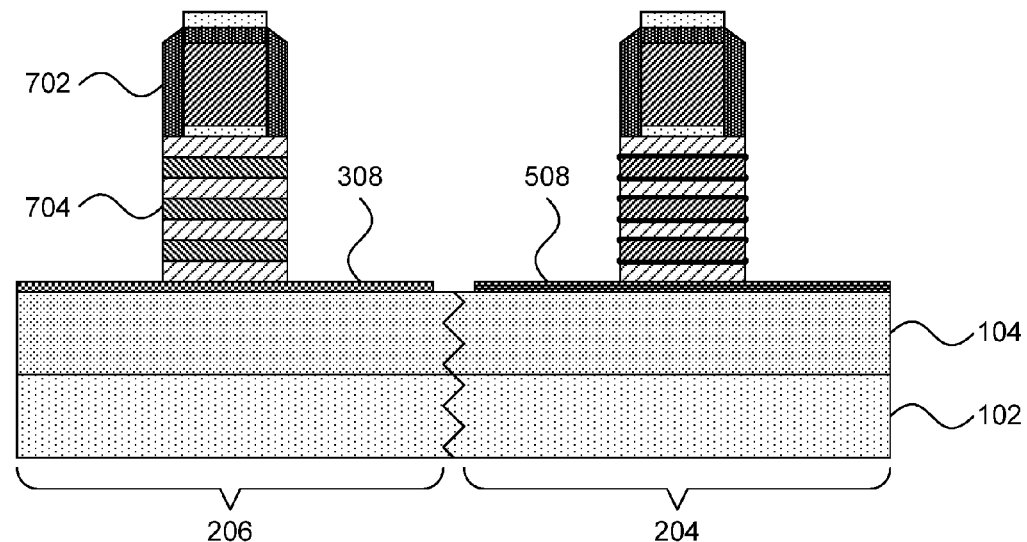
FIG. 7 is a cross-sectional diagram of a step in the formation of multiple nanosheet semiconductor devices on a single chip in accordance with the present principles.

Referring now to FIG. 7, a step in forming multiple nanosheet devices having different channel materials is shown. Dummy gate spacers 702 are deposited along the vertical sidewalls of the dummy gate stacks 600. The stacks of semiconductor materials are then etched anisotropically using, e.g., RIE, to trim any such material outside of the channel regions 704 defined by the dummy spacers 702. The stacks are trimmed down to the underlying layers 308 and 508.

Figure 8:
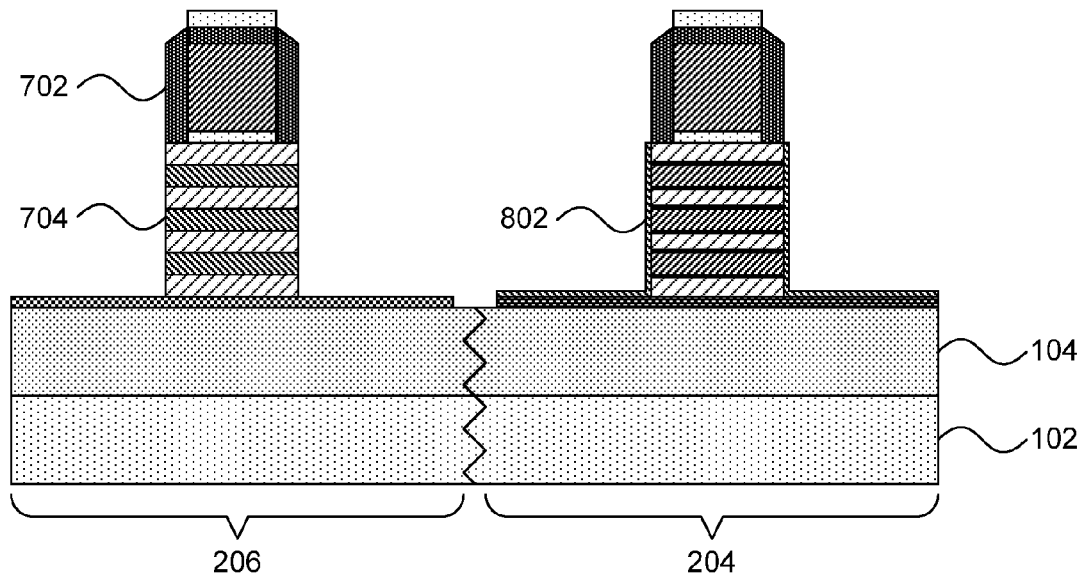
FIG. 8 is a cross-sectional diagram of a step in the formation of multiple nanosheet semiconductor devices on a single chip in accordance with the present principles.

Referring now to FIG. 8, a step in forming multiple nanosheet devices having different channel materials is shown. A thin liner layer 802 is deposited over the first device region 204. In an embodiment where the first device region 204 defines a pFET device having alternating layers of 50%-germanium silicon germanium and 30%-germanium silicon germanium, the thin liner layer 802 may be formed from silicon and may have an exemplary thickness of about 2 nm. This liner layer prevents lateral etch of the silicon germanium in the first device region 204 during subsequent processing steps. The liner 802 may be deposited using, e.g., CVD or any other conformal deposition process and may be prevented from forming in the second device region 206 by masking that region.

Figure 9:
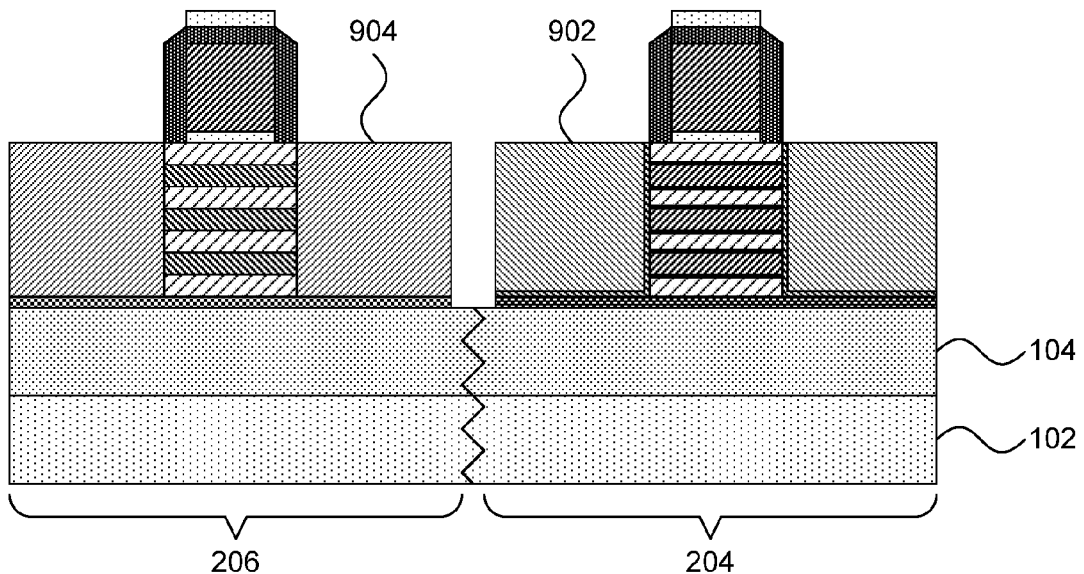
FIG. 9 is a cross-sectional diagram of a step in the formation of multiple nanosheet semiconductor devices on a single chip in accordance with the present principles.

Referring now to FIG. 9, a step in forming multiple nanosheet devices having different channel materials is shown. A first source/drain material 902 is deposited in the first device region 204 and a second source/drain material 904 is deposited in the second device region 206. It is contemplated that the first source/drain material 902 may include a semiconductor material that is doped with an n-type dopant. In one specific embodiment, the first source/drain material 902 may be boron-doped silicon germanium. It is similarly contemplated that the second source/drain material 904 may include a semiconductor material that is doped with a p-type dopant. In one specific embodiment, the second source/drain material 904 may be phosphorous-doped silicon carbide.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor In a silicon containing substrate examples of n-type dopants, i.e., impurities, include but are not limited to antimony, arsenic and phosphorous. A p-type device may include, for example, a p-type channel region, whereas an n-type device may include, for example, an n-type channel region. Dopants may be introduced into the source/drain regions 902 and 904 by implantation or may be formed in situ. In one particular embodiment, the source/drain regions 902 and 904 are grown epitaxially with their respective dopants being formed in situ.

Figure 10:
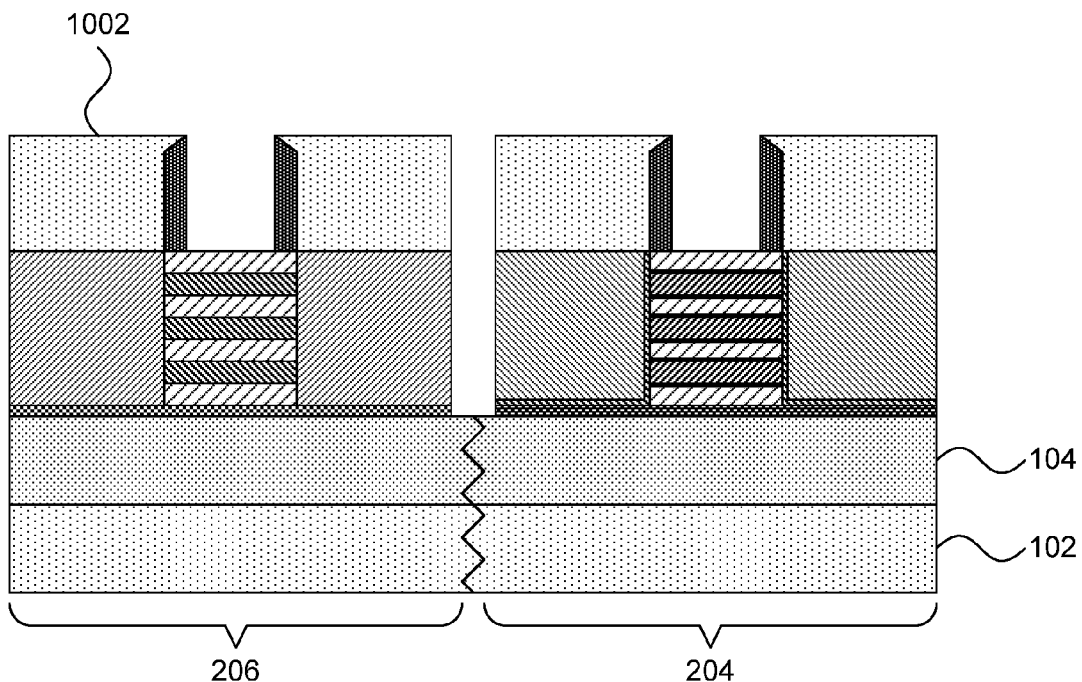
FIG. 10 is a cross-sectional diagram of a step in the formation of multiple nanosheet semiconductor devices on a single chip in accordance with the present principles.

Referring now to FIG. 10, a step in forming multiple nanosheet devices having different channel materials is shown. An insulator layer 1002 is filled in around the spacers 702 and the dummy gate stacks 600 are etched away. The insulator layer 1002 may be deposited using, e.g., CVD or any other appropriate deposition process. The insulator material may then be polished down to the level of the dummy gate stacks 600 using CMP. The gate stacks 600 themselves may be removed using an anisotropic etch such as, e.g., RIE, stopping on the underlying semiconductor layers.

Figure 11:
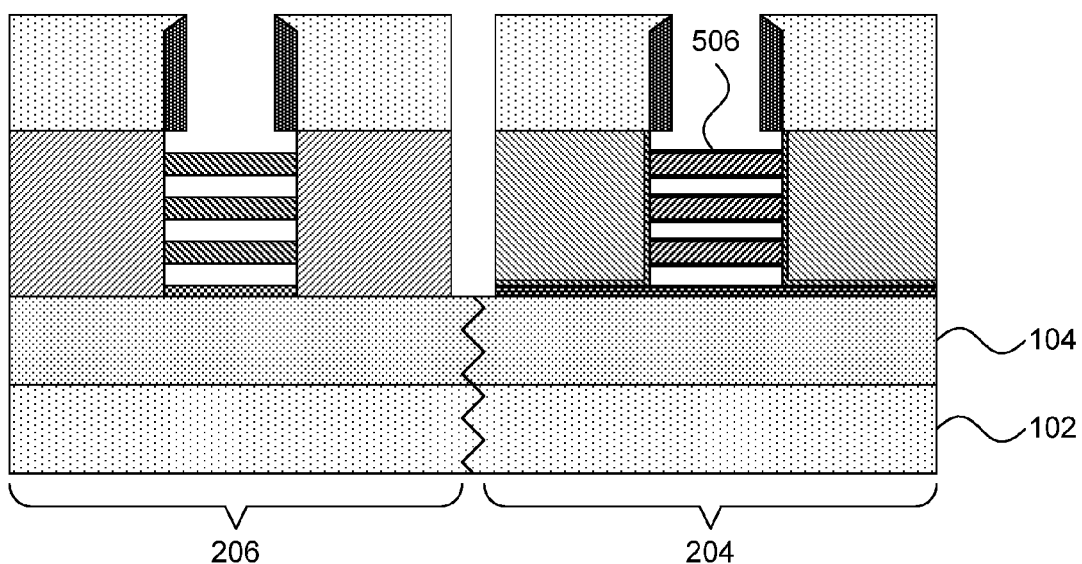
FIG. 11 is a cross-sectional diagram of a step in the formation of multiple nanosheet semiconductor devices on a single chip in accordance with the present principles.

Referring now to FIG. 11, a step in forming multiple nanosheet devices having different channel materials is shown. A wet chemical etch is used to remove the semiconductor layers 502 from the stacks 600 in both device regions 204 and 206. In an embodiment where these semiconductor layers are formed from 50%-germanium silicon germanium material, an etch using vapor-phase hydrochloric acid or wet "standard clean" using ammonium hydroxide and hydrogen peroxide is used to selectively remove the exposed silicon germanium. In the first device region 204, where a 30%-germanium silicon germanium layers 504 would potentially also be etched by the wet chemical etch, the thin semiconductor layer 506 (e.g., pure silicon) functions as an etch stop, preventing the etch from reaching the remaining layers 504.

Figure 12:
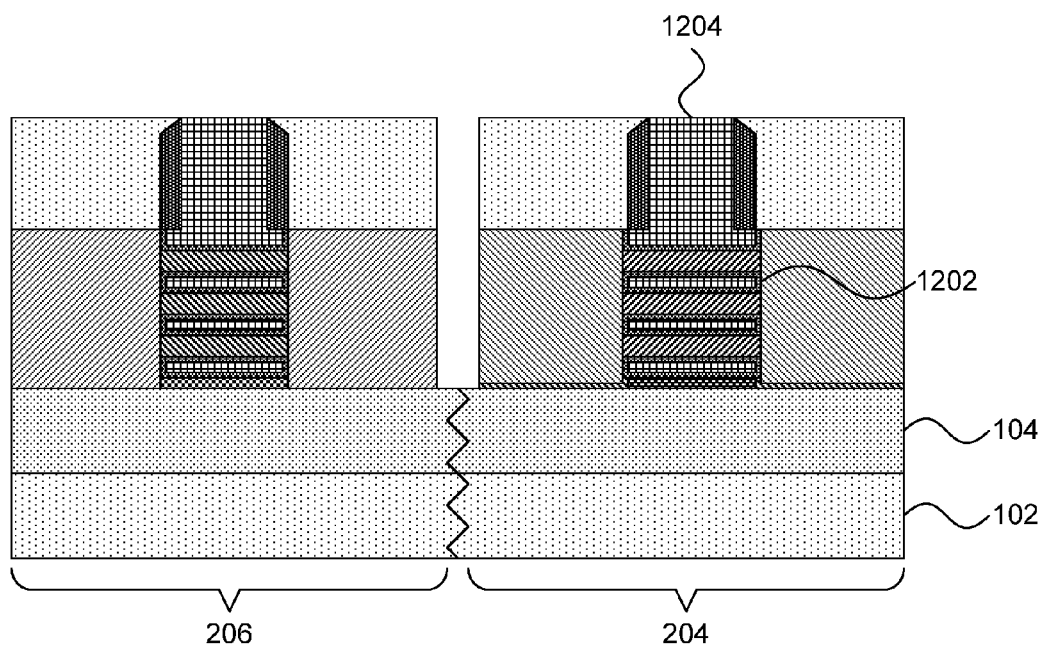
FIG. 12 is a cross-sectional diagram of a step in the formation of multiple nanosheet semiconductor devices on a single chip in accordance with the present principles.

Referring now to FIG. 12, a step in forming multiple nanosheet devices having different channel materials is shown. The protective silicon liners 506 and 802 are etched away during surface preparation using, e.g., oxidation with ozone or a "standard clean" was as described above. A gate dielectric 1202 is then conformally deposited around the remaining nanosheets 304 and 504 and a gate 1204 is filled in. The gate dielectric 1202 may be formed from a high-k dielectric, with exemplary materials including hafnium oxides, zirconium oxides, aluminum oxides, titanium oxides, lanthanum oxides, strontium titanium oxides, lanthanum aluminum oxides, and yttrium oxides. The gate 1204 may be formed from any appropriate workfunction material, with exemplary gate materials including titanium nitride and titanium carbide.

Figure 13:
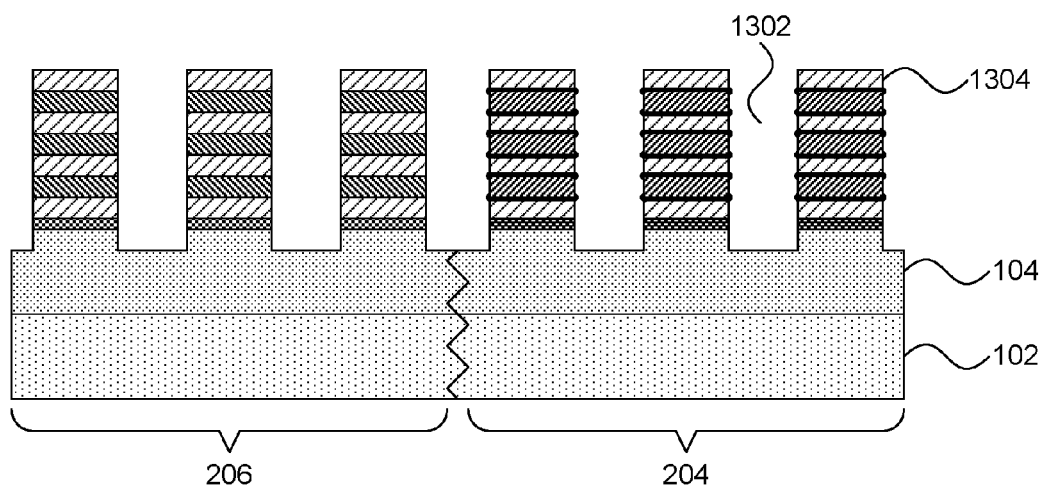
FIG. 13 is a cross-sectional diagram of a step in the formation of multiple nanosheet semiconductor devices on a single chip in accordance with the present principles.

Referring now to FIG. 13, a step in forming multiple nanosheet devices having different channel materials is shown. As noted above, the preceding figures showed steps performed along a single cross-section. FIG. 13 depicts an intermediate step between FIGS. 5 and 6, along cross sections perpendicular to the cross section depicted for each device region. This cross section occurs at a point laterally distant from the region that will eventually form the gate and channel regions, such that FIG. 13 and ensuing figures illustrate the source/drain regions. After removal of the hardmask 306, trenches 1302 are formed in the stacks in each of the device regions 204 and 206. The trenches may be formed using any appropriate anisotropic etch including, e.g., RIE. Notably, the trenches extend downward into the underlying semiconductor layer 104. This separates the initial stack of sheets into discrete fins 1304.

Figure 14:
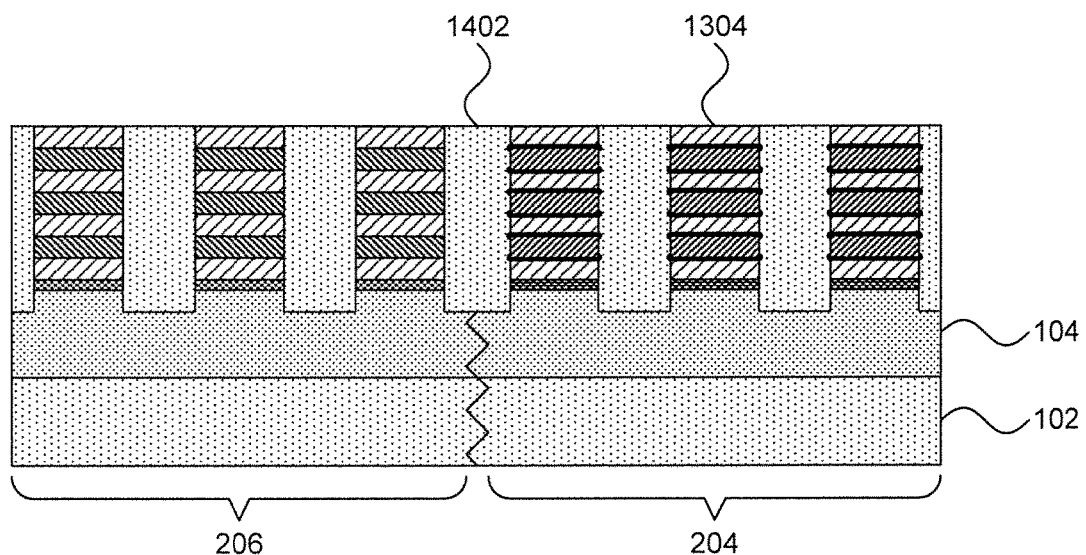
FIG. 14 is a cross-sectional diagram of a step in the formation of multiple nanosheet semiconductor devices on a single chip in accordance with the present principles.

Referring now to FIG. 14, a step in forming multiple nanosheet devices having different channel materials is shown. This figure follows the cross-section of FIG. 13 and illustrates the deposition of an insulator 1402 in the trenches 1302 between the fins 1304. It is specifically contemplated that silicon dioxide may be used as the insulator 1402, but it should be understood that other insulator materials may be used instead. In one embodiment, the insulator 1402 may be deposited a height above the height of the fins 1304 and then polished down to expose the tops of the fins 1304 using CMP.

Figure 15:
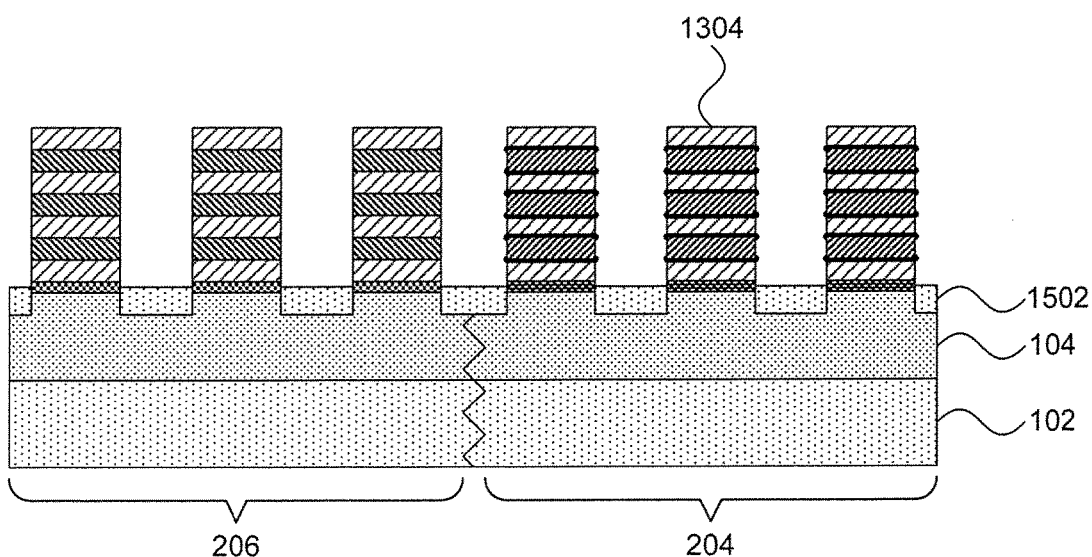
FIG. 15 is a cross-sectional diagram of a step in the formation of multiple nanosheet semiconductor devices on a single chip in accordance with the present principles.

Referring now to FIG. 15, a step in forming multiple nanosheet devices having different channel materials is shown. The insulator 1402 is etched down to expose the fins 1304, leaving a remaining insulator layer 1502 between the fins' bases. The insulator 1402 may be etched using a dry, plasma assisted etch process or may, alternatively, be etched using a wet etch such as with dilute hydrofluoric acid.

Figure 16:
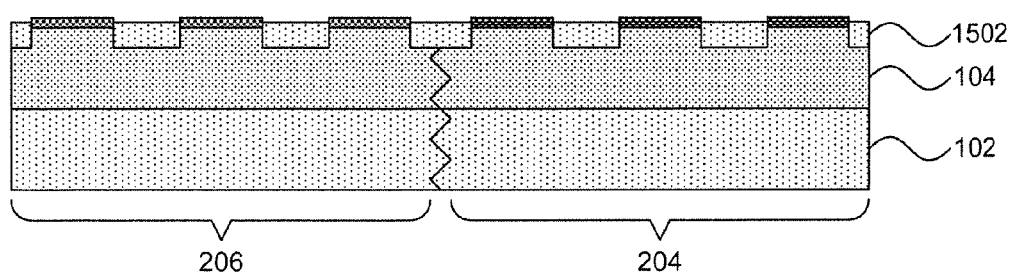
FIG. 16 is a cross-sectional diagram of a step in the formation of multiple nanosheet semiconductor devices on a single chip in accordance with the present principles.

Referring now to FIG. 16, a step in forming multiple nanosheet devices having different channel materials is shown. This figure shows an alternative view of FIG. 7, as the fins 1304 are etched in the source/drain regions to expose the underlying source/drain isolation layers 308 and 508. The source/drain isolation layers 308 and 508 can be formed with a high proportion of germanium and selectively removed using, e.g., a vapor phase hydrochloric acid etch or a wet "standard clean" etch and replaced with dielectric material. Alternatively, the source/drain isolation layers 308 and 508 may be selectively oxidized at moderate temperatures if the germanium concentration is high enough (e.g., greater than about 50%).

Figure 17:
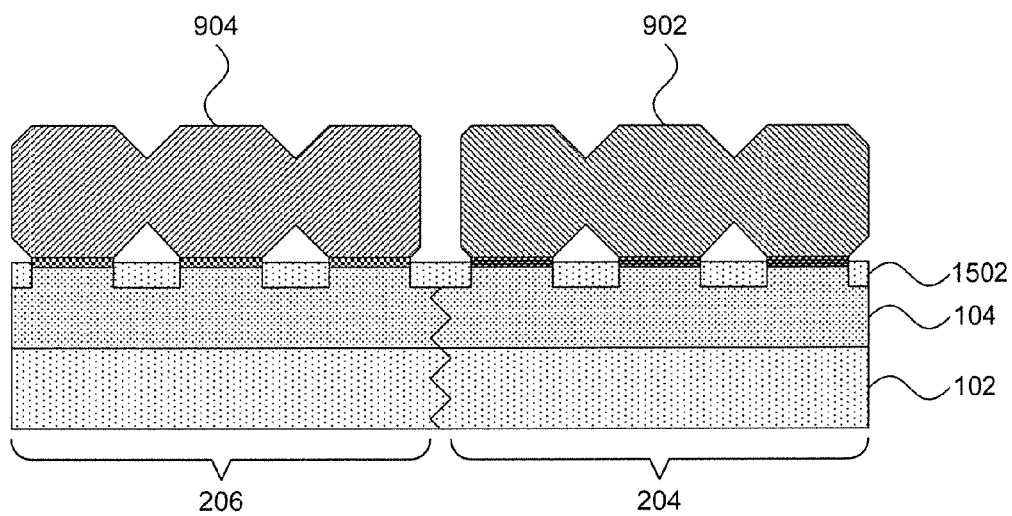
FIG. 17 is a cross-sectional diagram of a step in the formation of multiple nanosheet semiconductor devices on a single chip in accordance with the present principles.

Referring now to FIG. 17, a step in forming multiple nanosheet devices having different channel materials is shown. This step corresponds with FIG. 9 and shows the deposition of the source/drain regions 902 and 904 for the first and second device regions 204 and 206 respectively. As noted above, the material of the first source/drain region 902 may be grown epitaxially and in situ doped, with an exemplary embodiment using boron-doped silicon germanium. The material of the second source/drain region 904 may also be grown epitaxially and in situ doped, with an exemplary embodiment using phosphorous-doped silicon carbide. The source/drain regions on respective fin regions merge with one another to form the merged source/drain regions shown. It should be noted that the layers 308 and 508 may be used as a seed layer for the epitaxial growth.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 18:
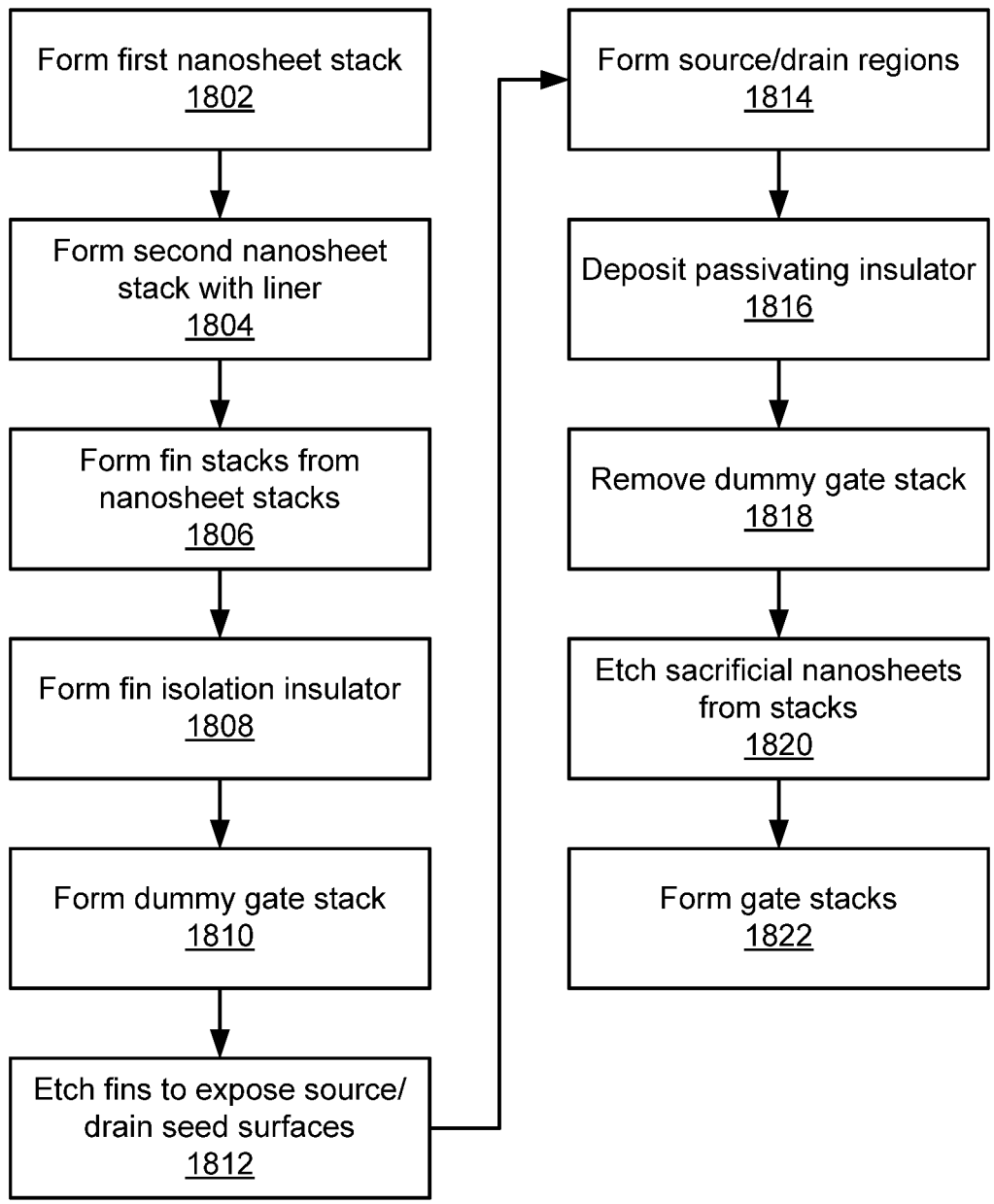
FIG. 18 is a block/flow diagram of a method of forming multiple nanosheet semiconductor devices on a single chip in accordance with the present principles.

Referring now to FIG. 18, a method of forming multiple nanosheet devices having different channel materials is shown. Block 1802 forms a first nanosheet stack on a substrate and block 1804 forms a second nanosheet stack on the substrate, the second nanosheet stack being formed with a different channel layer composition and having a liner 506. In one particular embodiment, the first nanosheet stack has channel layers 304 formed from silicon while the second nanosheet stack has channel layers 504 formed from 30%-germanium silicon germanium. In this embodiment, the liner 506 may be formed using silicon to protect the channel layers 504 of the of the second nanosheet stack. The sacrificial layers of the stack may be formed with, e.g., 50%-germanium silicon germanium.

Block 1806 forms fin stacks 1304 from the nanosheet stacks by etching the nanosheet stacks down, isolating adjacent fins from one another. Block 1808 forms a fin isolation insulator by depositing an insulator material 1402 (e.g., silicon dioxide) and etching the insulator material down to form an isolation layer 1502. Block 1810 then forms the dummy gate stack 600 over the respective fins of the first and second device regions.

Block 1812 etches the fin stack material outside of that covered by the dummy gates to expose the source/drain seed surfaces 308 and 508. Block 1814 then forms the source/drain regions 902 and 904 for the respective device regions. In one embodiment, the source/drain regions 902 and 904 are grown epitaxially and doped in situ.

Block 1816 deposits a passivating insulator 1002 over the fins and dummy gate stack 600. In one embodiment, the passivating insulator 1002 may be formed from silicon dioxide and may be deposited using CVD and planarized down to the level of the dummy gate stacks 600. Block 1818 then removes the dummy gate stacks 600, exposing the fin stacks. Block 1820 removes the sacrificial nanosheet material (e.g., 50%-germanium silicon germanium) from the fin stacks. In one embodiment the etch of block 1820 uses vapor-phase hydrochloric acid or wet "standard clean" wash to selectively remove silicon germanium while leaving pure silicon intact. The liner 506 protects the channel layers of the second fin stack from the etch of block 1820. Block 1822 then forms the gate stack over and around the channel layers to form two sets of semiconductor devices having distinct nanosheet channel materials.

Having described preferred embodiments of co-integration of silicon and silicon germanium channels for nanosheet devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming nanosheet semiconductor devices, comprising:
   forming a first nanosheet stack in a first device region comprising layers of a first channel material and layers of a sacrificial material;
   forming a second nanosheet stack in a second device region comprising layers of a second channel material, layers of the sacrificial material, and a liner formed around the layers of the second channel material;
   forming a dummy gate stacks over respective channel regions of each of the first and second nanosheet stacks;
   depositing a passivating insulator layer around the dummy gate stacks;
   etching away the dummy gate stacks;
   etching away the sacrificial material after etching away the dummy gate stacks, wherein the liner protects the second channel material from the etch; and
   forming gate stacks over and around the layers of first and second channel material to form respective first and second semiconductor devices in the first and second device regions.

2. The method of claim 1, wherein the first channel material is silicon and the second channel material is silicon germanium having a germanium concentration of about 30%.

3. The method of claim 2, wherein the liner is silicon.

4. The method of claim 1, wherein the sacrificial material is silicon germanium having a germanium concentration of about 50%.

5. The method of claim 1, further comprising etching away material of the first and second nanosheet stacks that is not covered by the dummy gate stacks to form first and second channel region stacks.

6. The method of claim 5, further comprising forming a vertical liner on sidewalls of the second channel region stack, wherein the vertical liner protects the second channel material from lateral etching.

7. The method of claim 5, further comprising etching trenches in the first and second nanosheet stacks to separate each nanosheet stack into a first and second plurality of nanosheet fins.

8. The method of claim 7, further comprising depositing source and drain regions at respective ends of each nanosheet fins, wherein source and drain regions of the first plurality of nanosheet fins are n-type doped and wherein the source and drain regions of the second plurality of nanosheet fins are p-type doped.

9. An integrated chip, comprising:
   a first semiconductor device comprising a plurality of first nanosheet channel layers of silicon;
   a second semiconductor device comprising a plurality of second nanosheet channel layers of silicon germanium having a germanium concentration of about 30% and a liner formed around the second nanosheet channel layers; and
   gate stacks formed over and around the first and second nanosheet channel layers respectively.

10. The integrated chip of claim 9, wherein the liner is silicon.

11. The integrated chip of claim 9, further comprising first and second source/drain regions at opposite ends of the respective first and second nanosheet channel layers.

12. The integrated chip of claim 11, wherein the source and drain regions of the first semiconductor device are n-type doped and wherein the source and drain regions of the second semiconductor device are p-type doped.

13. A method for forming nanosheet semiconductor devices, comprising:
   forming a first nanosheet stack in a first device region comprising silicon layers and layers of a sacrificial material;
   forming a second nanosheet stack in a second device region comprising silicon germanium layers having a germanium concentration of about 30%, layers of the sacrificial material, and a liner formed around the silicon germanium layers;
   etching away the sacrificial material, wherein the liner protects the silicon germanium layers from the etch; and
   forming gate stacks over and around the silicon layers and the silicon germanium layers to form respective first and second semiconductor devices in the first and second device regions.

14. The method of claim 13, wherein the liner is silicon.

15. The method of claim 13, wherein the sacrificial material is silicon germanium having a germanium concentration of about 50%.

* * * * *